US007001852B2

(12) United States Patent
Luo et al.

(10) Patent No.: US 7,001,852 B2
(45) Date of Patent: Feb. 21, 2006

(54) METHOD OF MAKING A HIGH QUALITY THIN DIELECTRIC LAYER

(75) Inventors: Tien-Ying Luo, Austin, TX (US); Olubunmi O. Adetutu, Austin, TX (US); Hsing-Huang Tseng, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/836,149

(22) Filed: Apr. 30, 2004

(65) Prior Publication Data

US 2005/0245019 A1 Nov. 3, 2005

(51) Int. Cl.
*H01L 21/31* (2006.01)

(52) U.S. Cl. ............... 438/775; 438/778; 438/766; 438/770

(58) Field of Classification Search ............... None
See application file for complete search history.

(56) References Cited

U.S. PATENT DOCUMENTS

2005/0130442 A1 * 6/2005 Visokay et al. ............. 438/775

* cited by examiner

*Primary Examiner*—Dung A. Le
(74) *Attorney, Agent, or Firm*—Michael J. Balconi-Lamica; Michael P. Noonan

(57) ABSTRACT

A method of making a high quality thin dielectric layer includes annealing a substrate and a base oxide layer overlying a top surface of the substrate at a first temperature in a first ambient and annealing the substrate and base oxide layer at a second temperature in a second ambient subsequent to the first anneal. The first ambient includes an inert gas ambient selected from the group consisting of a nitrogen, argon, and helium ambient. Prior to the first anneal, the base oxide layer has an initial thickness and an initial density. The first anneal causes a first density and thickness change in the base oxide layer from the initial thickness and density to a first thickness and density, with no incorporation of nitrogen, argon, or helium of the ambient within the base oxide layer. The first thickness is less than the initial thickness and the first density is greater than the initial density. The second anneal causes a second density and thickness change in the base oxide layer from the first thickness and density to a second thickness and density. The second thickness is larger than the first thickness and the second density is on the order of the greater than or equal to the first density.

33 Claims, 2 Drawing Sheets

METHOD OF MAKING A HIGH QUALITY THIN DIELECTRIC LAYER

BACKGROUND

1. Field

The present invention relates to semiconductor device manufacturing, and, more particularly, to apparatus and methods related to making high quality, thin dielectric layers.

2. Description of the Related Art

As semiconductor manufacturing process dimensions scale downward to provide increasingly smaller semiconductor devices, many previously minor issues gradually become important enough to warrant attention by the industry. One such issue arises as semiconductor layers in such devices decrease in thickness to become comparable to the thickness of ubiquitous, but heretofore largely ignored, by-product oxide layers which are very thin but which are of poor quality.

For example, the well known RCA cleaning process (so named for its corporate developer, the Radio Corporation of America) often leaves behind a chemical oxide layer. These chemical oxide layers typically exhibit low density and poor quality relative to purposefully formed, thicker oxide layers of present and past generation semiconductor processes. Because such chemical oxide layers have been relatively small in comparison to the other, purposefully formed layers, such chemical oxide layers have been largely ignored in the past. But while such layers may be safely ignored in larger scale devices, semiconductor devices in 90 nm processes or smaller must begin to account for the effects of such layers.

BRIEF DESCRIPTION OF THE DRAWINGS

The present invention may be better understood, and its numerous objects, features, and advantages made apparent to those skilled in the art, by referencing the accompanying drawings.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE PREFERRED EMBODIMENT(S)

The following discussion is intended to provide a detailed description of at least one example of the invention to help enable those skilled in the art to practice the invention. It is not intended to be limiting of the invention itself. Rather, any number of variations may fall within the scope of the invention which is properly defined in the claims following this description.

Figure 6:
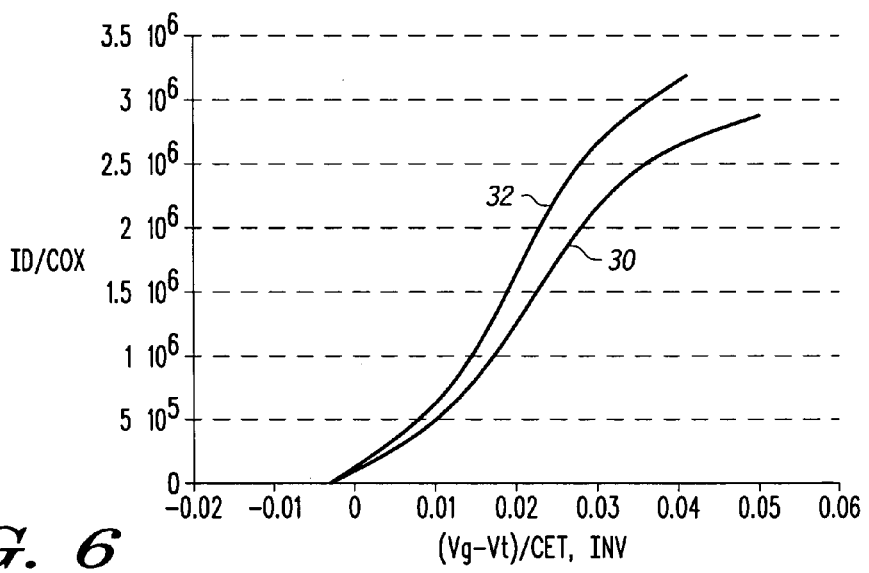
FIGS. 6 and 7 are graphs showing measured performance advantages of exemplary semiconductor devices fabricated according to an embodiment of the present invention.
Figure 7:
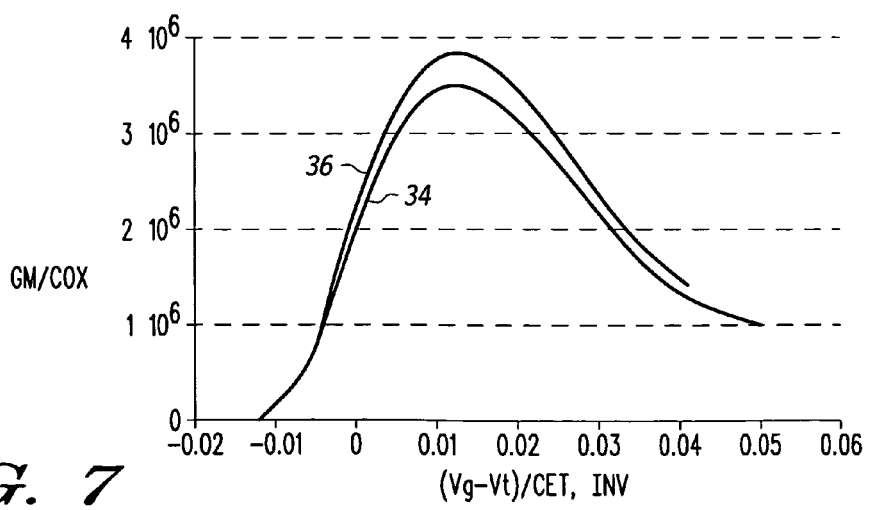

FIGS. 1–4 show cross-sectional views of a semiconductor wafer during stages in the manufacture of semiconductor devices (e.g., integrated circuits or specific devices therein) according to an embodiment of the present invention. As will be described in greater detail below, the illustrated embodiment provides a semiconductor device precursor with a substrate and base oxide layer (FIG. 1) and utilizes a high temperature double anneal process (FIGS. 2 and 3) to provide a thin (e.g., less than 13 angstroms) but high quality oxide layer (FIG. 3) as part of an overall integrated circuit device manufacturing process. One such double anneal process utilizes a high temperature (e.g., at ~1000° C.) $N_2$ anneal followed by an $O_2$ (e.g., at ~900° C.) anneal over a base oxide to densify and purify the base oxide, all without nitrogen incorporation into the base oxide. Topping layers (e.g., oxynitrides or high-K materials) may be formed over the double annealed base oxide layer (FIG. 4) with reduced concern regarding the resultantly diminished detrimental electrical effects of the base oxide layer. An exemplary semiconductor device is the transistor shown in FIG. 5 which includes the dielectric stack of FIG. 4 and operates with improved performance as shown in FIGS. 6 and 7.

Such a process can be useful, for example, in cases where thin but poor quality base oxide layers are generated as by-products of the manufacturing process (e.g., a cleaning process), and where such base oxide layers may interfere with any such topping layers. It can also be useful anytime a high quality, thin dielectric layer is desired. The quality of a layer may be improved, for example, by increasing physical density and decreasing defect density (e.g., by decreasing the number of traps).

Figure 1:
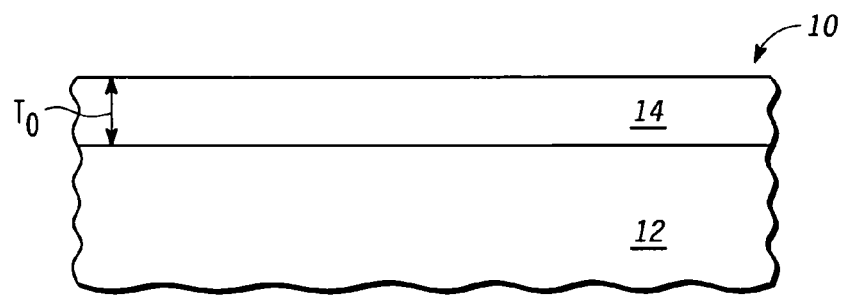
FIGS. 1–4 provide a series of partial cross-sectional views of a semiconductor device during various stages of manufacture of an integrated circuit according to an embodiment of the present invention.

FIG. 1 shows a semiconductor device 10. Semiconductor device 10 is or is comprised within an integrated circuit die. Semiconductor device 10 includes substrate 12 and base oxide layer 14. Because semiconductor device 10 is not yet complete at the presently illustrated stage of manufacture, it may be referred to as a semiconductor device precursor. Substrate 12 is a portion of an overall wafer at the presently illustrated stage of manufacture. Substrate 12 includes various features not discussed herein for sake of simplicity and to avoid obfuscation of the invention. Base oxide layer 14 is an exemplary dielectric layer having an illustrated thickness of $T_0$. Base oxide layer 14 may be one of several oxide layers of ultimately completed a semiconductor device 10 or may be the only oxide layer (e.g., the only gate dielectric) of semiconductor device 10.

Base oxide layer 14 may be a process by-product layer or an intentionally deposited layer. By-product base oxide layers, such as pretreatment oxides and/or chemical oxides, may result as a by-product of various semiconductor processes (e.g., the well known RCA cleaning process). Thus, in an embodiment employing the RCA cleaning process, and exemplary thickness $T_0$ of base oxide layer 14 is about 11 Å. As mentioned, base oxide layers created by the RCA cleaning process typically exhibit low density and poor quality relative to purposefully formed thick oxide layers.

Such base oxides have historically been present underneath subsequently deposited, thicker, and higher quality thermal oxides or high-K dielectrics or other topping layers, but the effects of such by-product oxides have been safely ignored due to the large size of such subsequently deposited layers relative to the base oxide layer. As the size of such topping layers decrease to accommodate smaller geometry semiconductor devices, the effects of the base oxide layers become more pronounced, and the quality of the base oxide layers therefore becomes more important. Also, as the size of devices decrease, such base oxide layers may be used as an integral part of, or as the sole part of, a dielectric layer such as gate dielectric in a transistor. However, such a use requires a minimal amount of quality not found in base oxide layers not processed according to the teachings herein.

Figure 2:
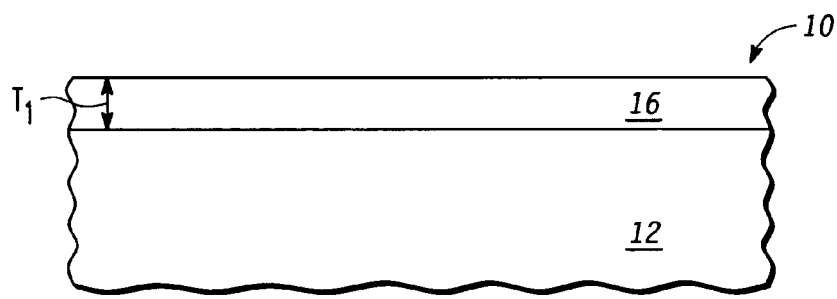

Referring to FIG. 2, semiconductor device 10 is subjected to a high temperature select ambient gas (e.g., $N_2$) anneal to produce base oxide layer 16 from base oxide layer 14 (FIG. 1). The high temperature $N_2$ anneal increases quality by removing impurities such as hydrogen from the base oxide layer. The high temperature $N_2$ anneal makes the base oxide layer 14 more dense and decreases the thickness of the base oxide layer. This is illustrated in FIG. 2 by base oxide layer 16 which exhibits a thickness $T_1$ which is less than the thickness $T_0$ of base oxide layer 14 of FIG. 1. For example, thickness $T_0$ may be around 10–12 Å whereas thickness $T_1$ may be around 6–7 Å.

Initial density $D_0$ of pre-$N_2$ anneal base oxide layer 14 (FIG. 1) will be less than a density $D_1$ of post-$N_2$ anneal base oxide layer 16 (FIG. 2). For example if thickness is approximately halved, density would approximately double.

Little to no nitrogen is incorporated into base oxide layer 16 during the $N_2$ anneal process. Such nitrogen incorporation might degrade carrier mobility, lower drive current and introduce $Si/SiO_2$ interface defects, and may be advantageously avoided by using molecular nitrogen gas instead of nitrogen compounds.

In the present embodiment, the select gas is $N_2$. Any type of inert gas (or combination thereof) may be used with or in place of $N_2$. For example, argon or helium may be used in place of the nitrogen. Any type of gas which inhibits incorporation of nitrogen or other impurities into the base oxide layer or the substrate may be used.

In the present embodiment, the high temperature anneal includes subjecting semiconductor device 10 to a temperature of approximately 1000° C. for 10–20 seconds using a rapid thermal annealing (RTA) tool. Other types of tools may be used, and the time can be appropriately adjusted for the use of different equipment. The time can even be adjusted for the use of different temperatures. Although the present embodiment heats at a temperature of 1000° C., other temperatures may be used, but generally it is understood to be advantageous to use temperatures not substantially lower than 900° C.

Figure 3:
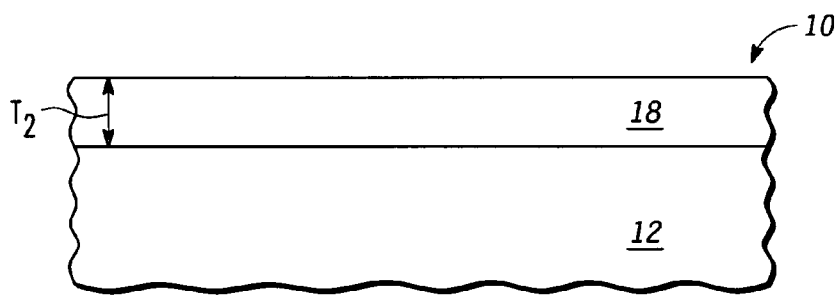

After the high temperature $N_2$ anneal, semiconductor device 10 is subjected to a high temperature oxygen-inclusive anneal to produce base oxide layer 18 from base oxide layer 16, as illustrated in FIG. 3. The primary goal of the $O_2$ anneal is to decrease defects in the thin film base oxide layer, but density and growth result as well.

The $O_2$ anneal causes the base oxide layer to grow as a result of oxidation. That is, thickness $T_2$ of post-$O_2$ anneal base oxide layer 18 (FIG. 3) is greater than thickness $T_1$ of pre-$O_2$ anneal base oxide layer 16 (FIG. 2). For example, thickness $T_2$ may be around 8–12 Å whereas thickness $T_1$ may be around 6–7 Å.

In the case of this $O_2$ anneal, although the base oxide layer thickness increases, the density of base oxide layer 18 increases (or at least does not decrease) in spite of the increased thickness. This is because the ambient $O_2$ will tend to cause additional oxidation of substrate 12 to grow the base oxide layer more than it decreases solely due to any density increase. Thus, a density $D_2$ of post-$O_2$ anneal base oxide layer 18 (FIG. 3) will generally not be less than a density $D_1$ of pre-$O_2$ anneal base oxide layer 16 (FIG. 2).

In the present embodiment, a diluted $O_2$ anneal is used so that the ambient gas includes around 25% $O_2$ and around 75% $N_2$ by volume. For example, the semiconductor device 10 is subjected to a flow of gas of approximately 1 standard liter/minute (SLM) $O_2$ and 3 SLM $N_2$. The $O_2$ anneal uses diluted $O_2$ to control the oxidation rate of substrate 12. More dilution by the introduction of a greater percentage of $N_2$ (or other gas) results in a slower rate of oxidation and therefore a slower rate in the growth of base oxide layer 18. Other formulations of the oxygen-inclusive annealing gas may be used. Any type of or combination of low reactive gas such as the noble gases may be used with or in place of $N_2$. For example, argon or helium may be used in place of the nitrogen.

In the present embodiment, the $O_2$ anneal includes subjecting semiconductor device 10 to a temperature of approximately 900° C. for 10–20 seconds using a rapid thermal annealing (RTA) tool. Other types of tools may be used, and the time can be appropriately adjusted for the use of different equipment. The time can even be adjusted for the use of different temperatures. Although the present embodiment heats at a temperature of 900° C., other temperatures may be used, but generally it is understood to be advantageous to use temperatures not substantially lower than 800° C.

Thus, in one embodiment, a first $N_2$ anneal increases the density, decreases the thickness (e.g., from ~11 Å to ~6 Å) and substantially decreases the defects (i.e., increases the quality) of the base oxide layer, and a second $O_2$ anneal increases the thickness (e.g., form ~6 Å to ~12 Å), does not decrease the density and decreases the defects of the base oxide layer. The first anneal is primarily responsible for increased quality, but the second anneal also increases quality, so both anneals tend to purify. Both anneals increase density (or at least do not decrease density), with the first anneal increasing density more than the second anneal.

Figure 4:
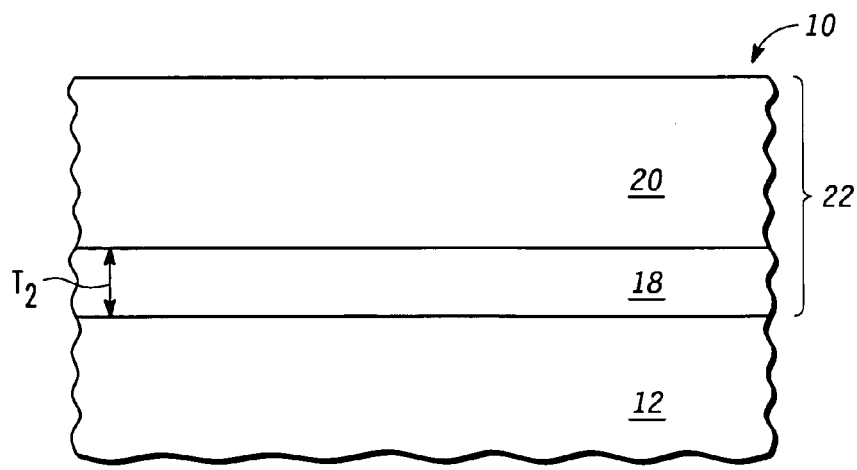

Referring to FIG. 4, a dielectric layer 20 is deposited over base oxide layer 18 after the $O_2$ anneal. Dielectric layer 20 may be, for example, an oxide, a nitride (e.g., SiN) or an oxynitride such as a plasma nitride oxide (PNO). Dielectric layer 20 may be a high-K dielectric material such as $HfO_2$ formed, for example, through atomic layer deposition (ALD) or chemical vapor deposition (CVD). As shown, dielectric layer 20 and base oxide layer 18 together form a combined portion of a device such as a stacked gate dielectric 22.

Figure 5:
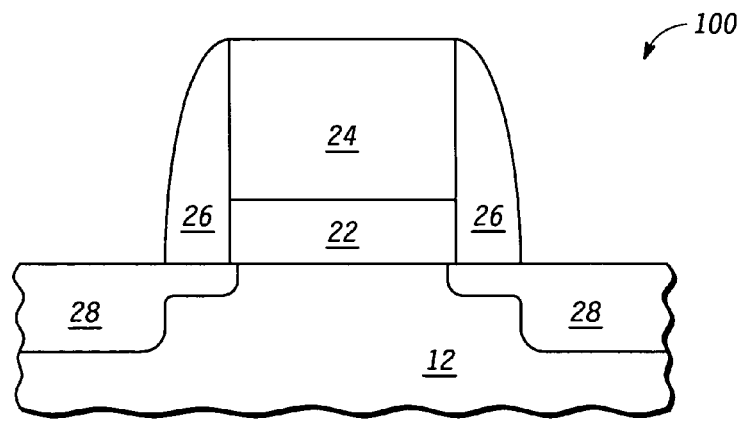
FIG. 5 is a cross-sectional drawing of an exemplary transistor fabricated according to an embodiment of the present invention.

Referring to FIG. 5, transistor 100 includes gate dielectric 22, a control electrode represented by gate 24, sidewall spacers 26, current handling electrodes represented by source and drain implant regions 28, and a channel region within substrate 12. Gate 24 may be any material suitable for a transistor control electrode such as polysilicon and metal or other conductor. In the illustrated embodiment, gate dielectric includes both base oxide layer 18 and dielectric layer 20 (as shown in FIG. 4). The overall thickness of gate dielectric 22 is reduced by the double anneal process when the base oxide layer is reduced. In another embodiment, gate dielectric 22 consists solely of base oxide layer 18. In one embodiment, transistor 100 has a channel length of 90 nm. Future embodiments may have channel lengths as small as 65 nm, 45 nm, 32 nm, or even smaller.

FIG. 6 is a graph illustrating the operation of a conventional n-type field effect transistor 30 (in this case, using a dielectric layer of ALD $HfO_2$ on unenhanced chemical oxide) and a similar field effect transistor 32 manufactured using one embodiment of the above described double anneal process (in this case, ALD $HfO_2$ on double annealed chemical oxide). Normalized device drive/drain current ($I_{drain}$/oxide capacitance) is graphed with respect to normalized device electric field (($V_{gate}-V_{threshold}$)/Capacitive Electrical Thickness$_{(Inversion)}$). As illustrated, the drive current of the conventional device 30 is consistently lower than the drive current of the specific presently disclosed embodiment transistor 32.

FIG. 7 is another graph illustrating enhanced transconductance, and therefore mobility, offered by transistors manufactured using the above described double anneal process. The operation of a conventional transistor 34 (ALD HfO$_2$ on unenhanced chemical oxide) is graphed versus the operation of the present embodiment's transistor 36 (ALD HfO$_2$ on double annealed chemical oxide). Normalized device transconductance is graphed with respect to normalized device electric field. As illustrated, the mobility of the conventional device 34 is consistently lower than the mobility of the specific presently disclosed embodiment transistor 36. The double annealed device exhibits ~11% normalized peak Gm improvement over a same thickness device with unimproved chemical oxide.

A rapid thermal process (RTP) N$_2$/O$_2$ anneal embodiment of the invention has been described. The RTP N$_2$/O$_2$ anneal can be used to pre-treat chemical oxides before formation thereover of a thermal oxide, a high-K layer or other topping layer. This pretreatment allows smaller topping layers than have previously been possible. The double N$_2$/O$_2$ anneal can be applied to process technologies which need a gate dielectric of equivalent oxide thickness (EOT) of less than 13 Å for equivalent thermal oxide thickness of less than 20 Å.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

In one embodiment, a method of making a high quality thin dielectric layer is provided. First, a substrate having a base oxide layer overlying a top surface of the substrate is annealed at a first temperature in a first ambient. The base oxide layer has an initial thickness and an initial density. The first anneal causes a first density and thickness change in the base oxide layer from the initial thickness and density to a first thickness and density. No component of the ambient is incorporated within the base oxide layer. The first thickness is less than the initial thickness, and the first density is greater than the initial density. Secondly, the substrate and base oxide layer are annealed at a second temperature in a second ambient subsequent to the first anneal. The second anneal causes a second density and thickness change in the base oxide layer from the first thickness and density to a second thickness and density. The second thickness is larger than the first thickness and the second density is on the order of the greater than or equal to the first density.

In another further embodiment, the base oxide layer includes one selected from the group consisting of a chemical oxide, a thermal oxide, a rapid thermal oxide, and a pretreatment oxide.

In another further embodiment, the substrate includes one selected from the group consisting of a bulk substrate and a semiconductor on insulator substrate. In yet a further embodiment, the substrate further includes one selected from the group consisting of silicon, silicon germanium, and germanium. In another further embodiment, the initial thickness is on the order of approximately 10–11 angstroms (Å), the first thickness is on the order of approximately 6–7 angstroms (Å), and the second thickness is on the order of approximately 8–12 angstroms (Å).

In another further embodiment, the first thickness change is up to fifty percent (50%) of the initial thickness, and the first density change is up to double the initial density. In another further embodiment, the first thickness change is approximately fifty percent (50%) of the initial thickness and the first density change is approximately double the initial density. In another further embodiment, the second thickness change is on the order of up to or greater than one hundred percent (100%) of the first thickness. In another further embodiment, the second density is on the order of greater than or equal to double the initial density.

In a further embodiment, the first ambient includes an inert gas ambient. In yet a further embodiment, the inert gas ambient includes one selected from the group consisting of a nitrogen, argon, and helium ambient. In another further embodiment, the first ambient comprises a nitrogen ambient, and the first anneal causes densification of the base oxide layer with no incorporation of nitrogen within the base oxide layer. In a further embodiment, the second ambient includes a dilute oxygen ambient. In yet a further embodiment, the dilute oxygen ambient includes a mixture of oxygen and an inert gas. In a further embodiment, the inert gas includes one selected from the group consisting of nitrogen, argon, and helium. In a further embodiment, the dilute oxygen ambient includes a volume mixture on the order of twenty-five percent (25%) oxygen and seventy-five percent (75%) inert gas.

In another further embodiment, the first anneal includes a high temperature anneal and the first temperature comprises a temperature in the range of 900–1000° C. In another further embodiment, the first anneal includes a time duration on the order of 10–20 seconds. In another further embodiment, the first anneal includes one selected from the group consisting of a rapid thermal anneal and a furnace anneal. In another further embodiment, the second anneal includes a high temperature anneal and the second temperature comprises a temperature above 800° C. In yet a further embodiment, the second temperature is approximately 900° C. In another further embodiment, the second anneal includes a time duration on the order of 10–20 seconds. In another further embodiment, the second anneal includes one selected from the group consisting of a rapid thermal anneal tool anneal and a furnace anneal.

In another further embodiment, the first anneal reduces defects in the base oxide layer to improve a quality of the base oxide layer. In another further embodiment, the second anneal further substantially reduces defects in the base oxide layer to further improve a quality of the base oxide layer.

In another further embodiment, the method includes forming a second dielectric layer overlying the base oxide layer, wherein the second dielectric layer and base oxide layer comprise a dielectric stack. In yet a further embodiment, the forming of the second dielectric layer includes forming one selected from the group consisting of a oxide, nitride, oxynitride, and high-k dielectric layer. In still another further embodiment, the forming of the second dielectric layer overlying the base oxide layer includes nitridation. In still another further embodiment, the forming of the second dielectric layer overlying the base oxide layer includes atomic layer deposition of an oxide. In yet a further embodiment, the oxide includes a metal oxide.

In another further embodiment, a semiconductor device includes a high quality thin dielectric layer formed by the method(s) taught herein. In another further embodiment an integrated circuit includes a semiconductor device having a high quality thin dielectric layer formed by the method(s) taught herein.

In another embodiment, a method of making a high quality thin dielectric layer includes a first step of annealing a substrate at a first temperature in a first ambient, and a second step of annealing the substrate at a second temperature in a second ambient. The substrate has a base oxide layer overlying a top surface of the substrate. The base oxide layer has an initial thickness and an initial density. The first anneal causes a density and thickness change in the base oxide layer from the initial thickness and density to a first thickness and density, with no incorporation of a component of the ambient within the base oxide layer. The first thickness is less than the initial thickness and the first density is greater than the initial density. The first ambient is or includes a nitrogen ambient. The first anneal causes a densification of the base oxide layer with no incorporation of nitrogen within the base oxide layer. The thickness change is on the order of fifty percent (50%). The density change is on the order of double the initial density. The second anneal causes a second density and thickness change in the base oxide layer from the first thickness and density to a second thickness and density. The second thickness is larger than the first thickness. The second density is on the order of the greater than or equal to the first density. The second ambient is or includes a dilute oxygen ambient.

In another embodiment, a method of manufacturing a semiconductor device includes the steps of providing a semiconductor device precursor including a substrate and a first dielectric layer disposed over the substrate, double annealing the first dielectric layer to improve the quality of the dielectric layer, forming a second dielectric layer over the first dielectric layer to provide a stacked dielectric layer including the first and second dielectric layers, and forming the semiconductor device to include the stacked dielectric layer.

In a further embodiment, the providing of the semiconductor device precursor includes providing the substrate, and cleaning the substrate such that the first dielectric layer is formed on the substrate as a result of the cleaning of the substrate.

In another further embodiment, the double annealing of the first dielectric layer includes heating the semiconductor device precursor at a first temperature in a first ambient, and heating the semiconductor device precursor at a second temperature in a second ambient different from the first ambient after heating the dielectric layer at the first temperature. The first ambient is selected to minimize incorporation of any component of the first ambient into the dielectric layer during heating. The second ambient is selected to encourage incorporation of a component of the second ambient into the dielectric layer during heating. In yet a further embodiment, the method includes the step of selecting the first ambient to include at least one of molecular nitrogen gas or the noble gases, and the step of selecting the second ambient to include a first percentage of molecular oxygen gas and a second percentage of at least one of molecular nitrogen gas or the noble gases. A sum of the first and second percentages substantially equals 100% in one such embodiment. In yet a further embodiment, the first temperature is not substantially less than 900° C.; and the second temperature is not substantially less than 800° C.

In another further embodiment, the forming the semiconductor device (including the stacked dielectric layer) includes forming a control electrode over the stacked dielectric layer, and forming first and second current handling electrodes proximate to the stacked dielectric layer. The control electrode being configured to control current flow under the dielectric layer between the first and second current handling electrodes depending on a potential of the control electrode.

In another embodiment, a method of manufacturing a semiconductor device including a control electrode, a dielectric layer and current handling electrodes is provided. A semiconductor device precursor is provided. The semiconductor device precursor includes a substrate with a by-product oxide layer disposed over the substrate. The oxide layer is annealed (and densified) by first heating it at a first temperature in a first ambient. The first ambient has a composition which substantially prevents incorporation of any component of the first ambient into the dielectric layer during exposure to the first ambient. The oxide layer is annealed (and grown) to provide the dielectric layer by heating the oxide layer at a second temperature in a second ambient. The second ambient includes oxygen to grow the oxide layer. The control electrode is then formed over the oxide layer. The current handling electrodes are formed proximate to the oxide layer.

The foregoing components and devices are used herein as examples for sake of conceptual clarity. As for (nonexclusive) examples, transistor 100 is one example of a variety of type of transistors and other semiconductor devices which may be manufactured using the techniques taught herein. Consequently, as used herein these specific exemplars are intended to be representative of their more general classes. Furthermore, in general, the use of any specific exemplar herein is also intended to be representative of its class and the noninclusion of any specific devices in any exemplary lists herein should not be taken as indicating that limitation is desired.

The transistors described herein (whether bipolar, field effect, etc.) may be conceptualized as having a control terminal which controls the flow of current between a first current handling terminal and a second current handling terminal. An appropriate condition on the control terminal causes a current to flow from/to the first current handling terminal and to/from the second current handling terminal. For example, in a bipolar NPN transistor, the first current handling terminal is the collector, the control terminal is the base, and the second current handling terminal is the emitter, and in a field effect transistor (FET), the current handling terminals (often called electrodes) are the source and drain, and the control terminal (often called an electrode) is the gate.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

As used herein, the term "or" is generally used in its inclusive sense unless otherwise indicated by the context. That is, a claim element specifying "A or B" would read on a first apparatus or method including "A," a second apparatus or method including "B," and a third apparatus or method including "both A and B." If an exclusive sense of the term "or" is intended (e.g., to read upon the first and second products or methods, but not the third product or method mentioned above), such will be indicated by the additional use of a word such as "exclusive" or "exclusively" or "xor."

Based on the teachings herein, those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A method of making a high quality thin dielectric layer, comprising:
    annealing a substrate at a first temperature in a first ambient, the first ambient including an inert gas ambient selected from the group consisting of a nitrogen, argon, and helium ambient, and the substrate having a base oxide layer overlying a top surface of the substrate, the base oxide layer having an initial thickness and an initial density, wherein the first anneal causes a first density and thickness change in the base oxide layer from the initial thickness and density to a first thickness and density, with no incorporation of nitrogen, argon, or helium of the ambient within the base oxide layer, the first thickness being less than the initial thickness and the first density being greater than the initial density; and
    annealing the substrate and base oxide layer at a second temperature in a second ambient subsequent to the first anneal, wherein the second anneal causes a second density and thickness change in the base oxide layer from the first thickness and density to a second thickness and density, the second thickness being larger than the first thickness and the second density being on the order of the greater than or equal to the first density.

2. The method of claim 1, wherein the first ambient comprises a nitrogen ambient, and wherein the first anneal causes densification of the base oxide layer with no incorporation of nitrogen within the base oxide layer.

3. The method of claim 1, wherein the first thickness change is on the order of up to fifty percent (50%) of the initial thickness and the first density change is on the order of up to double the initial density.

4. The method of claim 1, wherein the first thickness change is approximately fifty percent (50%) of the initial thickness and the first density change is approximately double the initial density.

5. The method of claim 1, wherein the base oxide layer includes one selected from the group consisting of a chemical oxide, a thermal oxide, a rapid thermal oxide, and a pretreatment oxide.

6. The method of claim 1, wherein the first anneal includes a high temperature anneal and the first temperature comprises a temperature in the range of 900–1000° C.

7. The method of claim 6, further wherein the first anneal includes a time duration on the order of 10–20 seconds.

8. The method of claim 1, wherein the first anneal includes one selected from the group consisting of a rapid thermal anneal and a furnace anneal.

9. The method of claim 1, wherein the second thickness change is on the order of up to or greater than one hundred percent (100%) of the first thickness.

10. The method of claim 1, wherein the second density is on the order of greater than or equal to double the initial density.

11. The method of claim 1, further wherein the first anneal reduces defects in the base oxide layer to improve a quality of the base oxide layer.

12. The method of claim 1, further wherein the second anneal further substantially reduces defects in the base oxide layer to further improve a quality of the base oxide layer.

13. The method of claim 1, wherein the second ambient includes a dilute oxygen ambient.

14. The method of claim 13, further wherein the dilute oxygen ambient includes a mixture of oxygen and an inert gas.

15. The method of claim 14, wherein the inert gas includes one selected from the group consisting of nitrogen, argon, and helium.

16. The method of claim 13, further wherein the dilute oxygen ambient includes a volume mixture on the order of twenty-five percent (25%) oxygen and seventy-five percent (75%) inert gas.

17. The method of claim 1, wherein the second anneal includes a high temperature anneal and the second temperature comprises a temperature above 800° C.

18. The method of claim 17, further wherein the second temperature is approximately 900° C.

19. The method of claim 17, further wherein the second anneal includes a time duration on the order of 10–20 seconds.

20. The method of claim 1, wherein the second anneal includes one selected from the group consisting of a rapid thermal anneal tool anneal and a furnace anneal.

21. The method of claim 1, wherein the substrate includes one selected from the group consisting of a bulk substrate and a semiconductor on insulator substrate.

22. The method of claim 21, wherein the substrate further includes one selected from the group consisting of silicon, silicon germanium, and germanium.

23. The method of claim 1, wherein the initial thickness is on the order of approximately 10–11 angstroms (Å), the first thickness is on the order of approximately 6–7 angstroms (Å), and the second thickness is on the order of approximately 8–12 angstroms (Å).

24. The method of claim 1, further comprising:
  forming a second dielectric layer overlying the base oxide layer, wherein the second dielectric layer and base oxide layer comprise a dielectric stack.

25. The method of claim 24, wherein forming the second dielectric layer includes forming one selected from the group consisting of a oxide, nitride, oxynitride, and high-k dielectric layer.

26. The method of claim 24, wherein forming the second dielectric layer overlying the base oxide layer includes nitridation.

27. The method of claim 24, wherein forming the second dielectric layer overlying the base oxide layer includes atomic layer deposition of an oxide.

28. The method of claim 27, wherein the oxide includes a metal oxide.

29. A semiconductor device including a high quality thin dielectric layer formed by the method of claim 24.

30. An integrated circuit including a semiconductor device having a high quality thin dielectric layer formed by the method of claim 24.

31. A semiconductor device including a high quality thin dielectric layer formed by the method of claim 1.

32. An integrated circuit including a semiconductor device having a high quality thin dielectric layer formed by the method of claim 1.

33. A method of making a high quality thin dielectric layer, comprising:
  annealing a substrate at a first temperature in a first ambient, the substrate having a base oxide layer overlying a top surface of the substrate, the base oxide layer having an initial thickness and an initial density, wherein the first anneal causes a density and thickness change in the base oxide layer from the initial thickness and density to a first thickness and density, with no incorporation of a component of the ambient within the base oxide layer, the first thickness being less than the initial thickness and the first density being greater than the initial density, wherein the first ambient comprises a nitrogen ambient, the first anneal causes a densification of the base oxide layer with no incorporation of nitrogen within the base oxide layer, the thickness change is on the order of fifty percent (50%), and the density change is on the order of double the initial density; and
  annealing the substrate and base oxide layer at a second temperature in a second ambient subsequent to the first anneal, wherein the second anneal causes a second density and thickness change in the base oxide layer from the first thickness and density to a second thickness and density, the second thickness being larger than the first thickness and the second density being on the order of the greater than or equal to the first density, wherein the second ambient comprises a dilute oxygen ambient.

* * * * *